(12) United States Patent
Klein et al.

(10) Patent No.: US 11,139,644 B2
(45) Date of Patent: Oct. 5, 2021

(54) PASSIVE-INTERMODULATION-MITIGATING MOUNTING ASSEMBLY

(71) Applicant: Sabre Communications Corporation, Sioux City, IA (US)

(72) Inventors: Karson W. Klein, LeMars, IA (US); Michael James Burnett, Sioux City, IA (US); Jacob John Robinson, Pender, NE (US); Jeffery Richard Stangler, Yulee, FL (US); Paul Scott Everline, Flowery Branch, GA (US)

(73) Assignee: Sabre Communications Corporation, Sioux City, IA (US)

( * ) Notice: Subject to any disclaimer, the term of this patent is extended or adjusted under 35 U.S.C. 154(b) by 29 days.

(21) Appl. No.: 16/700,764

(22) Filed: Dec. 2, 2019

(65) Prior Publication Data
US 2021/0167589 A1   Jun. 3, 2021

(51) Int. Cl.
*H05K 7/02* (2006.01)
*H05K 7/04* (2006.01)
*H02G 3/22* (2006.01)
*H02G 7/00* (2006.01)
*H01Q 1/12* (2006.01)

(52) U.S. Cl.
CPC ............... *H02G 3/22* (2013.01); *H02G 7/00* (2013.01); *H05K 7/02* (2013.01); *H01Q 1/12* (2013.01)

(58) Field of Classification Search
USPC ........................................ 361/810
See application file for complete search history.

(56) References Cited

U.S. PATENT DOCUMENTS

| | | | | |
|---|---|---|---|---|
| 7,183,996 B2* | 2/2007 | Wensink | ............... | H01Q 1/125 343/882 |
| 2002/0105477 A1* | 8/2002 | Bragg | ................. | H01Q 19/13 343/892 |
| 2002/0196195 A1* | 12/2002 | Vermette | ............... | H01Q 1/125 343/882 |
| 2012/0228428 A1* | 9/2012 | Deganis | ............... | B64C 1/1492 244/129.3 |
| 2014/0220903 A1* | 8/2014 | Schulz | ................. | H01Q 21/28 455/67.7 |
| 2017/0264005 A1* | 9/2017 | Roy | ..................... | H01Q 1/1228 |
| 2018/0207502 A1* | 7/2018 | Remaklus | ............. | A63B 17/04 |

* cited by examiner

*Primary Examiner* — Hung S. Bui
(74) *Attorney, Agent, or Firm* — Schwegman Lundberg & Woessner, P.A.

(57) ABSTRACT

A passive-intermodulation-mitigating mounting assembly for a fixture, such as can be affixed to a utility or communications monopole can include a first bracket and a second bracket respectively defining a first through hole and a second through hole. In some examples, a mounting plate supports an antenna or a radio. A fastener can extend through the first through hole and the second through hole, for instance to couple the first bracket with the second bracket to attach the mounting assembly to a fixture. The passive-intermodulation-mitigating mounting assembly can include a bushing that can be inserted into a through hole, and the bushing can physically and electrically isolate the fastener from one or more of the brackets. The isolation of the bushing helps inhibit the passive-intermodulation of the mounting assembly when the fastener extends, via the first bushing, through at least one of the through holes.

15 Claims, 8 Drawing Sheets

PASSIVE-INTERMODULATION-MITIGATING MOUNTING ASSEMBLY

TECHNICAL FIELD

This document pertains generally, but not by way of limitation, to a mounting assembly configured to mount one or more of a radio or an antenna to a mounting fixture, such as can be located on a utility or communications monopole.

BACKGROUND

Utility poles support equipment (e.g., power wires, telecommunications equipment or wires, or the like) above ground level.

SUMMARY

The present inventors have recognized, among other things, that a problem to be solved can include inhibiting passive-intermodulation of mechanical components for a utility or communications system. Passive-intermodulation can introduce interference into one or more electromagnetic signals, such as those being communicated by a radio transceiver of a cellular or small cell or other communications system. Interference can degrade the performance of the system. In one approach, mechanical components (e.g., a chassis, housing, mounting bracket, fastener, support frame, monopole, or the like) are mated together (e.g., touching, adjacent, abutted, engaged, joined, interfacing, or the like). For instance, a fastener (e.g., a bolt, screw, nut, washer, or the like) can facilitate attaching a mounting bracket to a fixture (e.g., a mounting pipe, platform, support, frame, or the like) of a utility por or monopole. The fastener can extend through a portion of the mounting bracket, and the fastener can mate with the mounting bracket (e.g., an exterior surface of a bolt can touch a sidewall of a through hole of the mounting bracket).

The mating of the mechanical components can introduce non-linearities into the system. The non-linearities can cause passive-intermodulation of electromagnetic signals when the signals are transmitted through the mechanical components with a non-linear characteristic. Accordingly, the passive-intermodulation due to the mated mechanical components generates interference in the signals, for example between one or more cellular network signals (e.g., CDMA, LTE, 5G, or the like). The interference in the signals degrades the communications performance of the system.

The present subject matter can help provide a solution to these problems, such as by providing a passive-intermodulation-mitigating mounting assembly for a utility or communications monopole. The mounting assembly can include a first bracket, and the first bracket can define a first through hole and include a mounting plate extending from the first bracket. In some examples, the mounting plate supports an antenna or a radio (e.g., a radio for a cellular network). The mounting assembly can include a second bracket defining a second through hole. A fastener can extend through the first through hole and the second through hole, for instance to couple the first bracket with the second bracket to attach the mounting assembly to a fixture of the monopole.

The passive-intermodulation-mitigating mounting assembly can include a bushing, and the bushing can include a non-conductive material such as an insulating or dielectric material. The bushing can be configured for insertion into the first through hole or the second through hole, and the first bushing can physically and electrically isolate the fastener from the first bracket or the second bracket. The isolation of the first bushing from electrical conduction between mechanical components can help inhibit or reduce the passive-intermodulation of the mounting assembly when the fastener extends, via the first bushing, through at least one of the first through hole or the second through hole.

The isolation of the first bushing inhibits electrical conduction between the mechanical components. Accordingly, the first bushing reduces non-linearities in the system, for instance because metal components of the system (e.g., the fastener, first bracket, and second bracket) are physically and electrically isolated. The isolation provided by the first bushing can help inhibit or reduce the passive-intermodulation of the mounting assembly. As a result, the communications performance of the system is improved.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
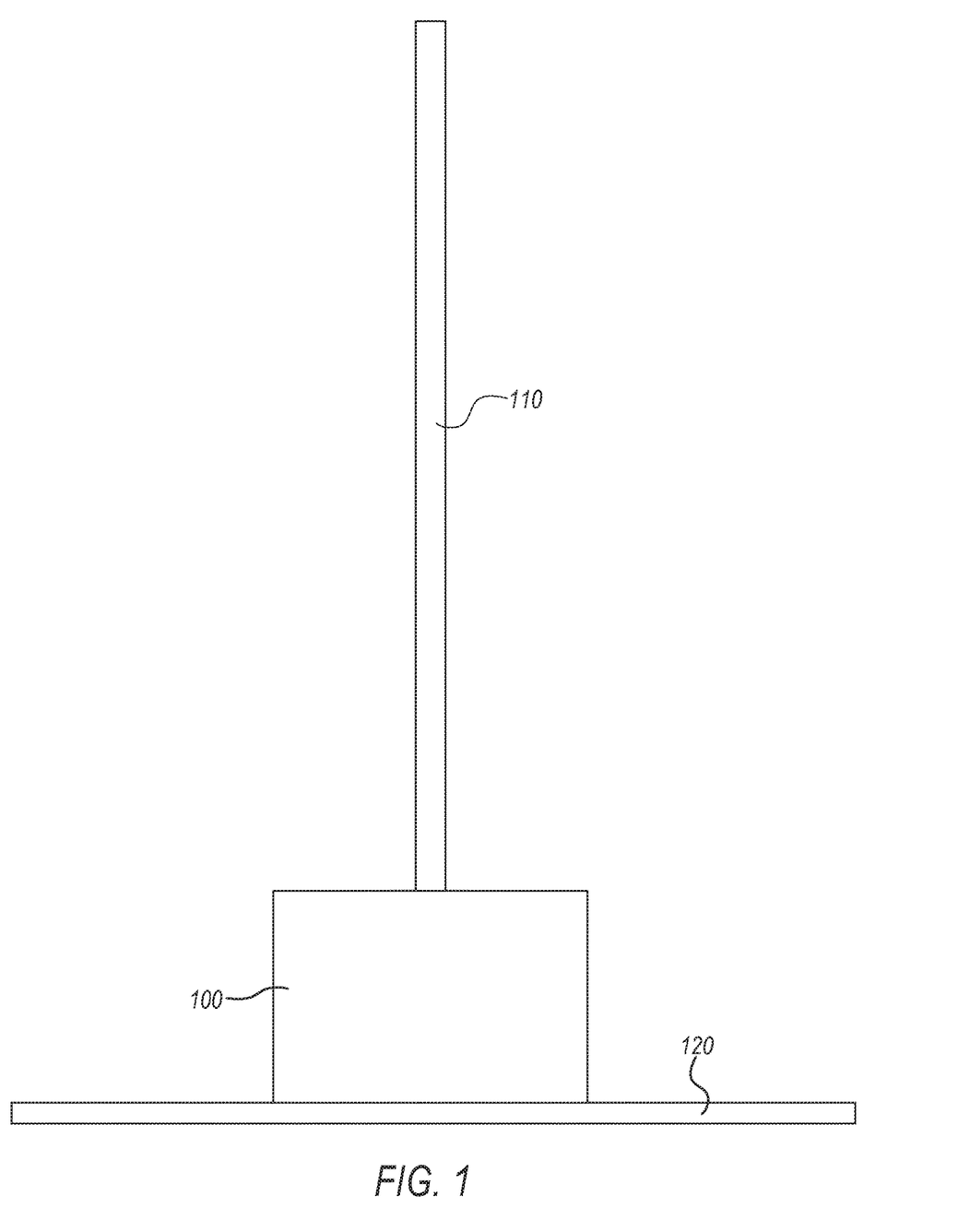
FIG. 1 illustrates a schematic view of a communications or other utility pole mounting structure and a monopole or other utility pole.

FIG. 1 illustrates a schematic view of a communications or other utility pole mounting structure 100 and a monopole or other communications or utility pole 110. The mounting structure 100 can be coupled to an anchoring surface 120 (e.g., a ground surface, a concrete footing, or the like). In one example, a portion of the mounting structure 100 is encased in concrete and then buried underground (e.g., with a fill material, for instance dirt, gravel, or the like). The pole 110 is configured to attach to the mounting structure 100, and the mounting structure 100 provides structural support for the pole 110.

The pole 110 can support equipment (e.g., power wires, telecommunication equipment or wires, or the like). In an example, a series of poles 110 are arranged alongside a roadway and power transmission lines are strung along the series of utility poles. In another example, cellular device infrastructure (e.g., antennas, data processing equipment, or the like) are coupled to the pole 110. The pole 110 extends a distance from the mounting structure 100 to elevate the equipment so that the equipment is isolated from the ground surface, for example to allow vehicles or people to travel beneath the equipment without coming into contact with the equipment.

Figure 2:
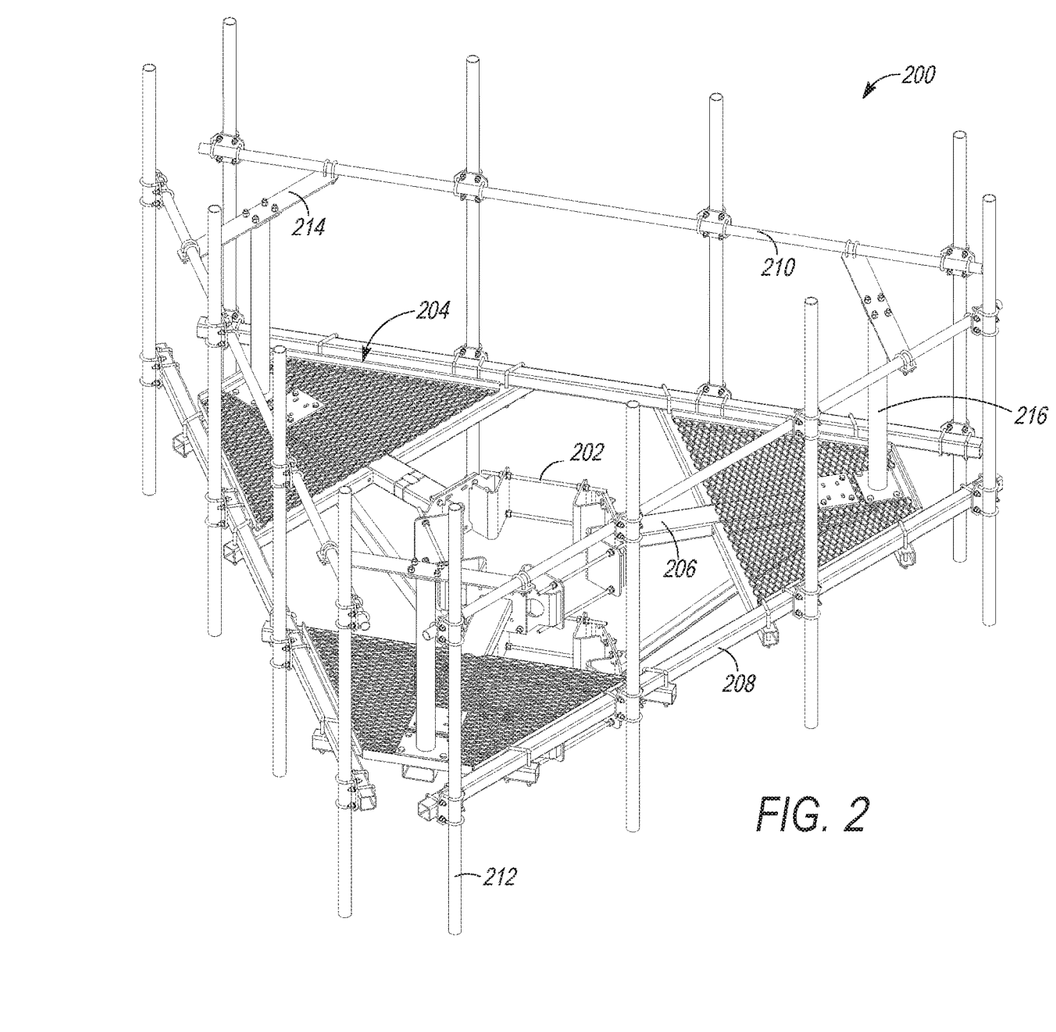
FIG. 2 illustrates an example of a platform assembly such as can be mounted onto a utility or communications monopole.

FIG. 2 illustrates an example of a platform assembly 200 such as can be mounted onto a monopole (e.g., the pole 110, shown in FIG. 1), such as via a bracket 202. In an example, the bracket 202 can include a collar, such as a tri-collar bracket assembly that can accommodate a 10 inch through 40 inch monopole extending there through. Any number (e.g., three or four) of platforms 204 can be mounted to the bracket 202, such as on arms 206 extending laterally and radially therefrom. The platforms 204 can respectively include a trapezoidal or other frame extending from the arms. A metal mesh or other flooring material can be welded or otherwise affixed to the frames of the platforms 204, such as to provide a floor or step that a human utility or communications worker can stand upon, such as while the communications worker is mounting communications or other equipment directly or indirectly to the monopole.

Adjacent platforms 204 can be connected and braced by square tube or other lower rails 208, which can be bolted to peripheral edges of the adjacent platforms, such as to form a triangle, such as shown in FIG. 1. A similar triangular arrangement of upper rails 210 can be located above corresponding lower rails 208. Vertical mounting pipes 212 can extend between the lower rails 208 and the corresponding upper rails 210, such as by being bolted thereto, such as using U-bolts, or otherwise. The vertical mounting pipes 212 can support the upper rails 210 above the corresponding lower rails 208. Corner connection plates 214 can be bolted between adjacent upper rails 210, such as using U-bolts or otherwise, such as to secure adjacent upper rails 210 to each other in their triangular arrangement.

The platform assembly 200 can include a number (e.g., one or more of three) of vertical pedestals 216 that can be bolted to and extend between respective platforms 204 and corresponding corner connection plates 214 that are located above such respective platforms 204. This can provide increased stability to the triangular arrangement of upper rails 210, which, in turn, can allow the platform assembly 200 to bear more equipment or other weight, including when there is variability in the height or vertical location of one or more of the individual vertical pipes 112.

Figure 3:
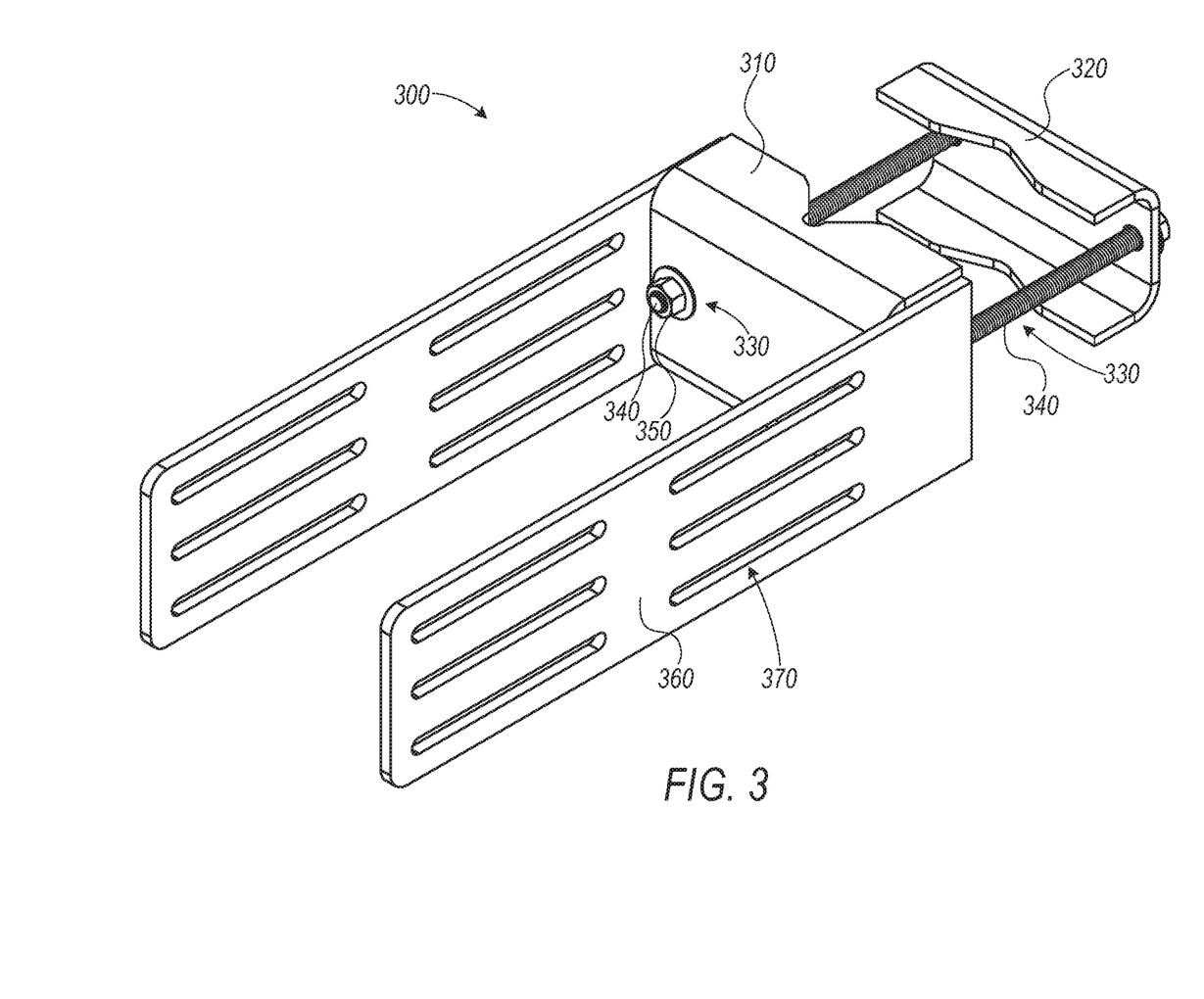
FIG. 3 illustrates a perspective view of an example of a passive-intermodulation-mitigating mounting assembly for a utility or communications pole.

FIG. 3 illustrates a perspective view of an example of a passive-intermodulation-mitigating mounting assembly 300 such as for mounting to a vertical pipe 212 or other fixture that can, in turn, be directly or indirectly mounted to a utility or communications pole (e.g., the monopole 110, shown in FIG. 1). The mounting assembly 300 can support one or more electronic components (e.g., a radio, antenna, or the like) and can facilitate mounting of such electronic components to the monopole 110 (shown in FIG. 1) or the platform assembly 200 (shown in FIG. 2). The passive-intermodulation-mitigating mounting assembly 300 can include a first bracket 310 and a second bracket 320. The brackets 310, 320 can attach to a fixture, for example one or more components of the platform assembly 200 (e.g., the vertical mounting pipes 212, shown in FIG. 2). For example, the brackets 310, 320 can straddle (e.g., surround, sandwich, or the like) a vertical mounting pipe 212 or one of the upper rails 210 such as to attach the mounting assembly 300 to the fixture.

One or more fasteners 330 can help couple the bracket 310 with the bracket 320 to attach the brackets 310, 320 to the fixture of the utility pole 110 (shown in FIG. 1) or platform assembly 200 (shown in FIG. 2). For example, the mounting assembly 300 can include a threaded rod 340 and a nut 350. The nut 350 can engage with the threaded rod 340 to couple the brackets 310, 320 together. For instance, the threaded rod 340 can extend through the brackets 310, 320 and the nut 350 can engage with the threaded rod 340 to couple (e.g., secure, fix, join, or the like) the first bracket 310 with the second bracket 320. In an example, the brackets 310, 320 straddle a fixture (e.g., the vertical mounting pipes 212) and the threaded rod 340 and the nut 350 help attach the mounting assembly 300 to the fixture, for instance by compressing the brackets 310, 320 against the fixture.

As described herein, the mounting assembly 300 supports one or more electronic components (e.g., a radio, antenna, or the like) and facilitates indirect mounting of the electronic components to a fixture, such as can in turn be mounted to the pole 110 (shown in FIG. 1) or the platform assembly 200 (shown in FIG. 2). For example, a mounting plate 360 can extend from one or more of the brackets 310, 320 and the electronic components can be coupled to the mounting plate 360. The mounting plate 360 can define one or more mounting features 370 that facilitate attachment of the electronic components to the mounting plate 360. For instance, the mounting features 370 can include (but are not limited to) a slot, groove, ridge, keyway, key, through hole, channel, socket, plug, or like. In an example, the electronic component (or a fastener, for instance a bolt) engages with the mounting features 370 such as to attach the electronic components to the mounting plate 360. One or more of the fasteners 330 can extend through the mounting features 370, for instance to attach the electronic components to the mounting plate 360.

Figure 4:
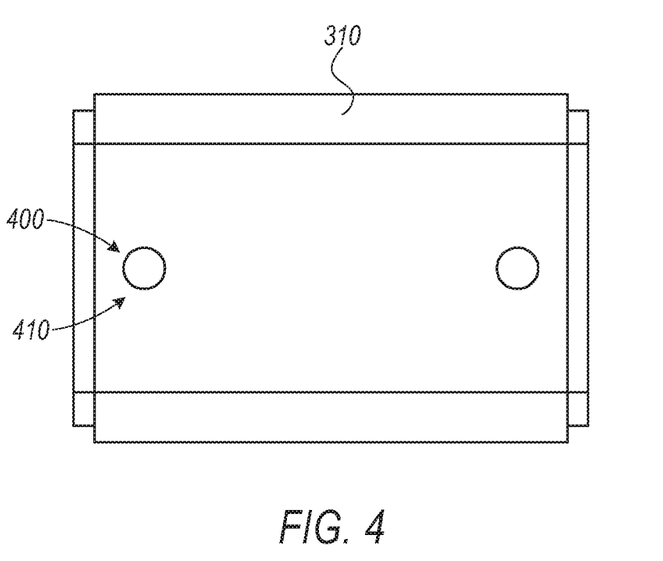
FIG. 4 illustrates an end view of the first bracket.
Figure 5:
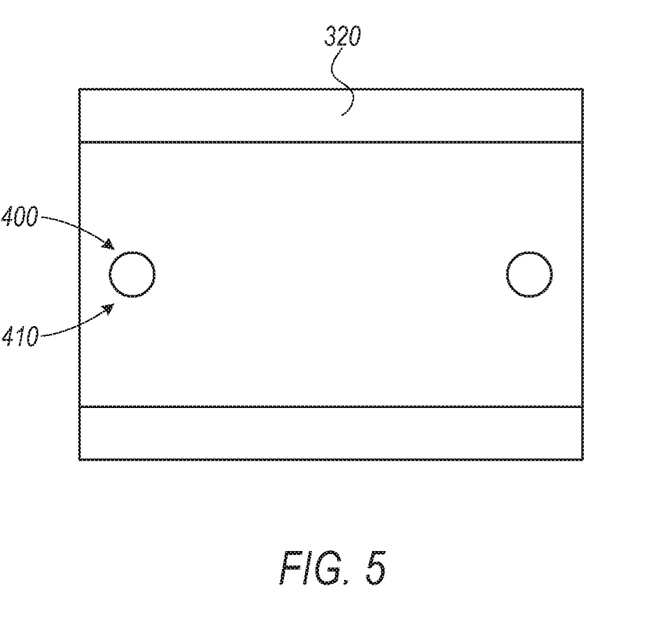
FIG. 5 illustrates an end view of the second bracket.

FIG. 4 and FIG. 5 illustrate end views of the first bracket 310 and the second bracket 320, respectively. The bracket 310 (or the bracket 320) can define a through hole 400. The through hole can extend through a thickness of the bracket 310. The through hole 400 can be sized and shaped to receive one or more of the fasteners 330, for instance the threaded rod 340 (shown in FIG. 3). Accordingly, a through hole profile 410 of the through hole 400 can correspond to a profile (e.g., one or more of cross-section, shape, size, dimensions, contour, radius, perimeter, circumference, outline, boundary, configuration, pattern, arrangement, thickness or the like) of one or more of the fasteners 330.

Figure 6:
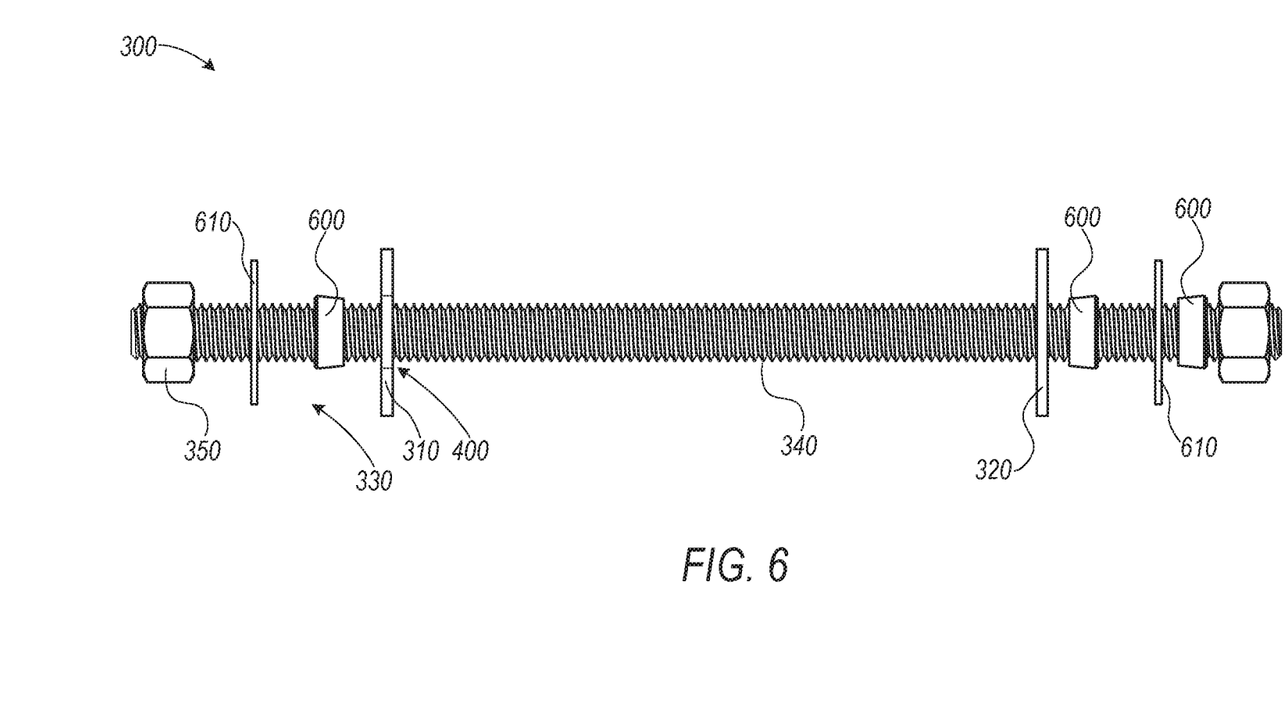
FIG. 6 illustrates a side view of another example of the passive-intermodulation-mitigating mounting assembly.

FIG. 6 illustrates a side view of another example of the passive-intermodulation-mitigating mounting assembly 300. The graphical representation of the brackets 310, 320 has been simplified in FIG. 6 for clarity. The passive-intermodulation-mitigating mounting assembly 300 can include an insulating or dielectric bushing 600 that helps physically and electrically isolate the fasteners 330 from the brackets 310, 320. For example, the bushing 600 can be located between the bracket 310 and the fasteners 330 (or between the bracket 320 and the fasteners 330). The electrical isolation provided by the bushing 600 can help inhibit electrical conduction between the mechanical components of the utility or communications system and thereby reduces passive-intermodulation of electromagnetic signals that would otherwise be transmitted via electrical conduction through the mechanical components.

In an example, the through hole 400 can be sized and shaped to receive the bushing 600, and the bushing 600 can be inserted into the through hole 400. The bushing 600 can physically and electrically isolate the threaded rod 340 from the brackets 310, 320 when the threaded rod 340 extends through the through hole 400 of the brackets 310, 320 (respectively). The bushing 600 can physically and electrically isolate the washer 610 and the nut 350 from the bracket 310, such as by providing a physical barrier between the fasteners 330 and the brackets 310, 320. Optionally, the bushing 600 is located between individual ones of the fasteners 330 to physically and electrically isolate an individual one of the fasteners 330 from another one of the fasteners 330 (e.g., the bushing 600 can be located between the washer 610 and the nut 350), for example to physically and electrically isolate the fasteners 330 from each other.

The bushing 600 can include an insulating or dielectric material (e.g., a polymeric material, ceramic material, or the like), and accordingly the bushing 600 can electrically isolate components of the utility or communications system. The bushing 600 can have a stiff durometer to support the mechanical loads between components of the mounting assembly 300. For example, the bushing 600 can have a durometer measured in accordance with, for example, the American Society for Testing and Materials ("ASTM") Standard D2240 A and within a range of approximately 90 A to approximately 100 A. The fasteners 330 can include (but are not limited to) threaded rod 340, nut 350, a washer 610, a bolt, or a screw.

Figure 7:
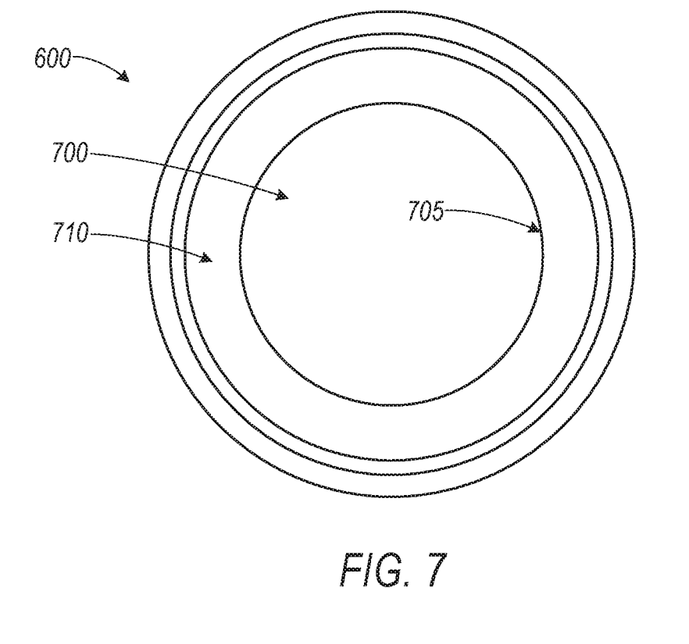
FIG. 7 illustrates a top view of a bushing.
Figure 8:
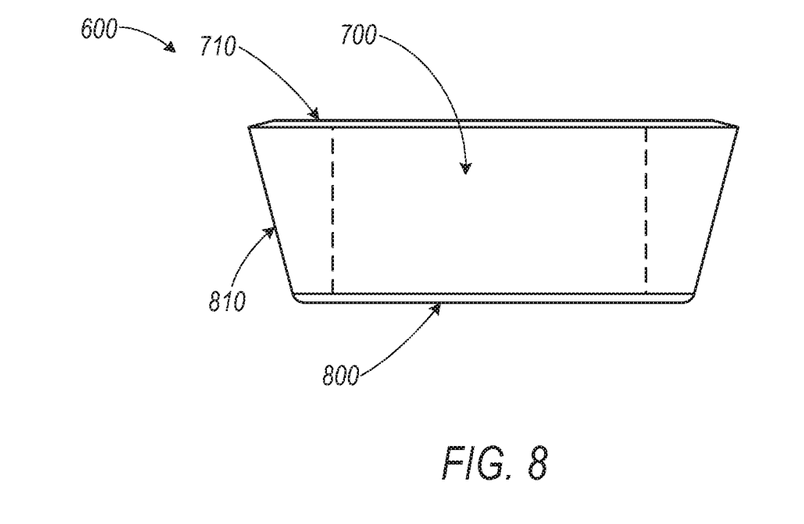
FIG. 8 illustrates a side view of the bushing of FIG. 7.

FIG. 7 and FIG. 8 illustrate a top view and a side view (respectively) of the bushing 600. The bushing 600 defines a fastener aperture 700 that extends through a thickness of the bushing 600. For example, the bushing includes aperture walls 705 that surround the fastener aperture 700. The fastener aperture 700 can extend between a first face 710 of the bushing 600 to a second face 800 of the bushing 600. The fastener aperture 700 is sized and shaped to receive one or more of the fasteners 330, for instance the threaded rod 340. The bushing 600 can physically and electrically isolate the fasteners 330 (e.g., the threaded rod 340) from the bracket 310 (or the bracket 320) when the fasteners 330 extend through the through hole 400 (shown in FIG. 6) via the bushing 600 (shown in FIG. 10).

The bushing 600 can include a tapered side wall 810, and the tapered side wall can extend between the faces 710, 800 of the bushing 600. In an example, the first face 710 has a first dimension (e.g., diameter, width, or the like) and the second face 800 has a second dimension that is less than the first dimension of the first face 710. The tapered side wall 810 extends between the faces 710, 800, for instance to provide a transition between varying dimensions of the bushing 600.

The bushing 600 includes a bushing profile 720. The bushing profile 720 can be frustoconical, for instance to facilitate insertion of the bushing 600 into the through hole 400 (shown in FIG. 10). The bushing profile 720 can correspond with the through hole profile 410 of the through hole 400 (shown in FIG. 4) to allow through hole 400 to receive at least a portion of the bushing 600. The fastener aperture 700 can receive one or more of the fasteners 330, and the aperture walls 705 can be located between the fasteners 330 and the bracket 310 (or the bracket 320). In an example, the bushing 600 physically isolates the fasteners 330 from the bracket 310 when the aperture walls 705 are located between one or more of the fasteners 330 and the bracket 310. Physically and electrically isolating the fasteners 330 from the brackets 310, 320 helps inhibit non-linearities in a utility or communications system, and helps inhibit passive-intermodulation of electromagnetic signals transmitted through mechanical components of the utility or communications system.

Figure 9:
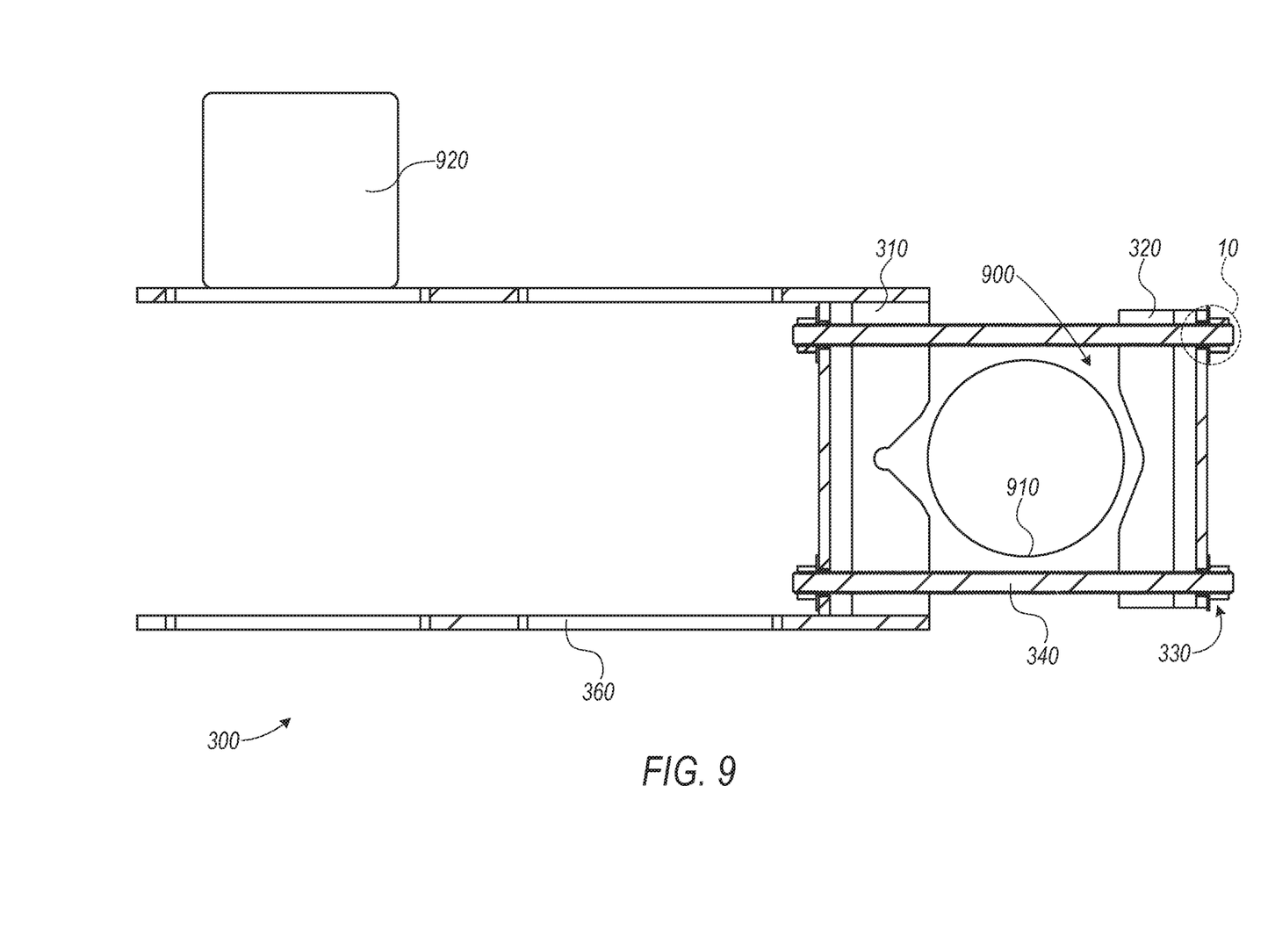
FIG. 9 illustrates a cross-sectional view of the passive-intermodulation-mitigating mounting assembly.

FIG. 9 illustrates a cross-sectional view of the passive-intermodulation-mitigating mounting assembly 300. The mounting assembly 300 can define a fixture recess 900 sized and shaped to receive a fixture 910. As described herein, the fixture 910 can include one or more components of the utility pole 110 or the platform assembly 200. In an example, the brackets 310, 320 can straddle the mounting pipe 212. The fasteners 330 (e.g., the threaded rod 340) can extend through the brackets 310, 320 and can be physically and electrically isolated from the fixture 910 (and the brackets 310, 320). For instance, the threaded rod 340 can be spaced apart from the fixture 910 when the brackets 310, 320 engage with the fixture 910 to attach the mounting assembly 300 to the fixture 910. In an example, the fasteners 330 can be operated (e.g., by a user manipulating the nut 350) to compress the brackets 310, 320 against the fixture 910 and attach the mounting assembly 300 to the fixture 910.

As described herein, the mounting assembly 300 supports one or more electronic components 920 (e.g., a radio, antenna, or the like) and facilitates mounting of the electronic components to a fixture of the utility pole 110 (shown in FIG. 1) or the platform assembly 200 (shown in FIG. 2). For example, the electronic components 920 can be coupled to the mounting plate 360. The mounting plate 360 can extend from one or more of the brackets 310, 320 and can support the electronic components 920 when the mounting assembly 300 is attached to a fixture of the utility pole 110 or the platform assembly 200.

FIG. 9 shows a circle 10. The circle 10 indicates the position of the partial view shown in FIG. 10.

Figure 10:
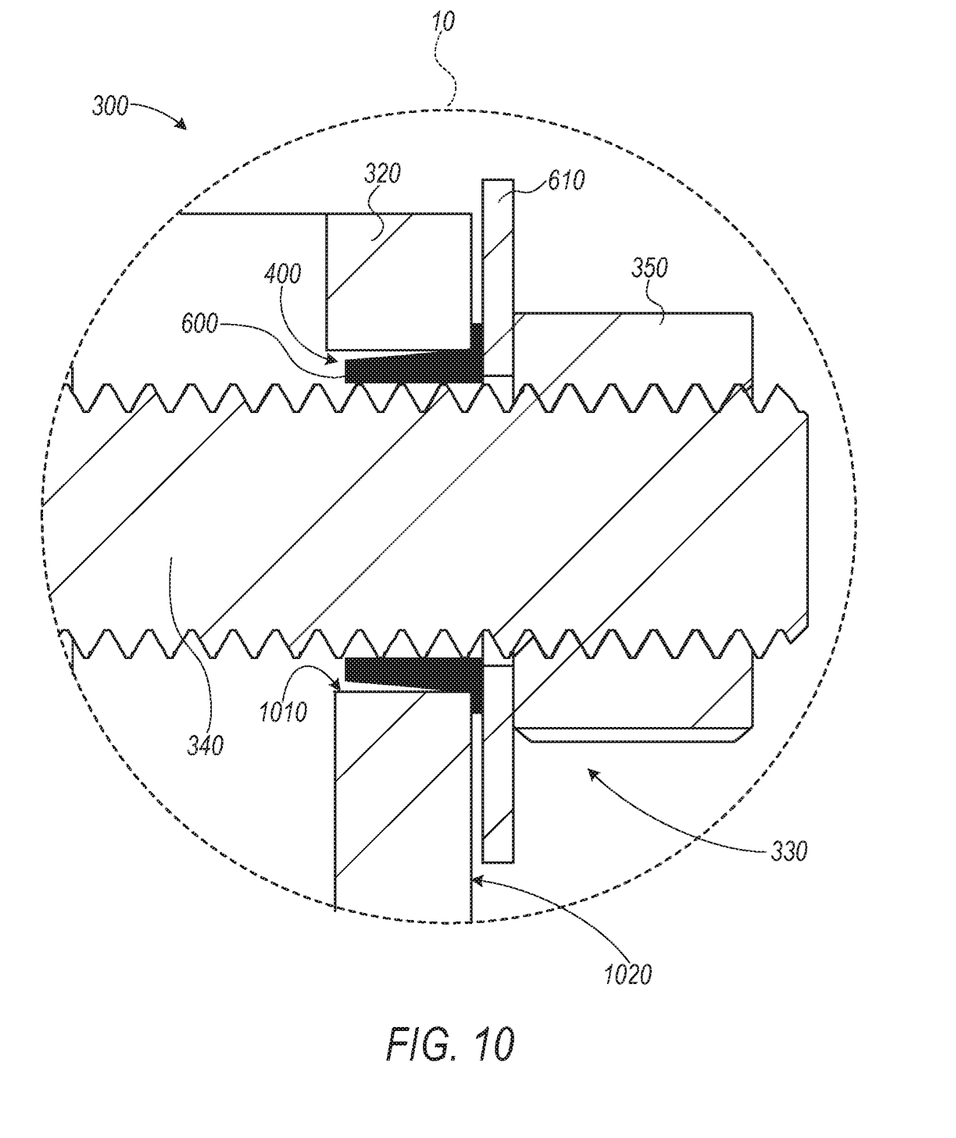
FIG. 10 illustrates a partial cross-sectional view of the passive-intermodulation-mitigating mounting assembly.

FIG. 10 illustrates a partial cross-sectional view of the passive-intermodulation-mitigating mounting assembly 300 at the position indicated by the circle 10 in FIG. 9. As described herein, the bushing 600 helps inhibit passive-intermodulation of components of a utility or communications system (e.g., the mounting assembly 300, platform assembly 200, monopole 100, electronic components 920, or the like). For example, the bushing 600 can physically and electrically isolate the fasteners 330 (e.g., one or more of the threaded rod 340, the washer 610, or the nut 350) from the bracket 310 (or bracket 320) when the fasteners 330 extend through the through hole 400 via the bushing 600. The bushing 600 can project from a bracket face 1020 of the bracket 320 (or the bracket 310, shown in FIG. 3). For instance, the bushing 600 can be located between the face 1020 of the bracket 320 and the washer 610 (or the nut 350) to help physically and electrically isolate the fasteners 330 from the bracket 320 (or the bracket 310). Optionally, the bushing 600 includes a tab, flange, appendage or the like that is located between the face 1020 and the fasteners 330 (e.g., the washer 610).

As described herein, the bushing 600 can be inserted into the through hole 400 to physically and electrically isolate one or more of the fasteners 330 from the brackets 310, 320. The bushing 600 can be located between the fasteners 330 and the brackets 310, 320 to help physically and electrically isolate the fasteners 330 from the brackets 300. In some examples, the bushing 600 has an interference fit with the through hole 400 (and/or the fasteners 300), such as by engaging the tapered side wall 810 (e.g., as shown in FIG. 8) with a bracket wall 1010 that surrounds the through hole 400.

In some examples, the bushing 600 can physically and electrically isolate when the bushing 600 is inserted into the through hole 400 and one or more of the fasteners 330 extend through the through holes 400 via the bushing 600. For instance, the bushing 600 physically and electrically isolates when the fasteners 330 are received in the fastener aperture 700 and the bushing 600 is inserted into the through hole 400. The physical and electrical isolation provided by the bushing 600 inhibits passive-intermodulation of components of a utility or telecommunications system. For example, the bushing 600 can inhibit or reduce electrical conduction between adjacent electrically conductive mechanical components (e.g., metal components, or the like) of the utility or telecommunications system (e.g., the threaded rod 340 and the bracket 320). The bushing 600 reduces mating of mechanical components and thereby inhibits the presence non-linearities within the utility or telecommunications system. Accordingly, the performance of the utility or telecommunications system is improved by the passive-intermodulation-mitigating mounting assembly 300.

Various Notes & Aspects

Aspect 1 can include or use subject matter (such as an apparatus, a system, a device, a method, a means for performing acts, or a device readable medium including instructions that, when performed by the device, can cause the device to perform acts), such as can include or use a passive-intermodulation-mitigating mounting assembly for a utility or communications fixture, the mounting assembly comprising: a first bracket defining a first through hole and including a mounting plate extending from the first bracket, wherein the mounting plate is configured to support an antenna or a radio; a second bracket defining a second through hole; a fastener configured to extend through the first through hole and the second through hole to couple the first bracket with the second bracket to attach the mounting assembly to the fixture; and a first bushing including a dielectric material configured for insertion into the first through hole or the second through hole to physically and electrically isolate the fastener from the first bracket or the second bracket, wherein the isolation of the first bushing inhibits the passive intermodulation of the mounting assembly when the fastener extends, via the first bushing, through at least one of the first through hole or the second through hole.

Aspect 2 can include or use, or can optionally be combined with the subject matter of Aspect 1, to optionally include or use wherein the first bushing includes a frusto-conical profile, and: a first face and a second face opposite to the first face; a tapered side wall extending between the first face and the second face; and a fastener aperture extending through the first bushing between the first face and the second face, wherein the fastener aperture is configured to receive the fastener and the tapered side wall is configured to engage with a wall surrounding the first through hole or the second through hole to physically isolate the fastener when the fastener extends, through the aperture and thereby through the first through hole of the first bracket or the second through hole of the second bracket.

Aspect 3 can include or use, or can optionally be combined with the subject matter of one or any combination of Aspects 1 or 2 to optionally include or use wherein the first bushing is configured for insertion into the first through hole and to physically and electrically isolate the fastener from the first bracket, and further comprising: a second bushing including the dielectric material configured for insertion into the second through hole to physically and electrically isolate the fastener from the first bracket or the second bracket, wherein the isolation of the first bushing inhibits the passive intermodulation of the mounting assembly when the fastener extends, via the first bushing, through at least one of the first through hole or the second through hole.

Aspect 4 can include or use, or can optionally be combined with the subject matter of one or any combination of Aspects 1 through 3 to optionally include or use wherein the first bushing projects from a face of the first bracket or the second bracket, and the first bushing is located between the fastener and the face of the first bracket or the second bracket.

Aspect 5 can include or use, or can optionally be combined with the subject matter of one or any combination of Aspects 1 through 4 to optionally include or use wherein the dielectric material includes a polymeric material.

Aspect 6 can include or use, or can optionally be combined with the subject matter of one or any combination of Aspects 1 through 5 to optionally include or use wherein the dielectric material has a durometer within a range of approximately 90 A to approximately 100 A.

Aspect 7 can include or use, or can optionally be combined with the subject matter of one or any combination of Aspects 1 through 6 to optionally include or use wherein the fastener is included in a plurality of fasteners, and the plurality of fasteners includes one or more of a bolt, screw, threaded rod, washer, or nut.

Aspect 8 can include or use, or can optionally be combined with the subject matter of Aspect 7 to optionally include or use wherein the first bushing physically and electrically isolates at least two of the plurality of fasteners from the first bracket or the second bracket.

Aspect 9 may include or use subject matter (such as an apparatus, a system, a device, a method, a means for performing acts, or a device readable medium including instructions that, when performed by the device, may cause the device to perform acts), such as may include or use a passive-intermodulation-mitigating mounting assembly for a utility or communications fixture, comprising: a first bracket defining a first through hole and including a mounting plate extending from the first bracket, wherein the mounting plate is configured to support an electronic component; the electronic component coupled to the mounting plate; a second bracket defining a second through hole; a fastener configured to extend through the first through hole and the second through hole to couple the first bracket with the second bracket to attach the mounting assembly to the fixture; and a first bushing including a dielectric material configured for insertion into the first through hole or the second through hole to physically and electrically isolate the fastener from the first bracket or the second bracket, wherein the isolation of the first bushing inhibits the passive-intermodulation of the mounting assembly when the fastener extends, via the first bushing, through at least one of the first through hole or the second through hole.

Aspect 10 may include or use, or may optionally be combined with the subject matter of Aspect 9, to optionally include or use wherein the first bushing inhibits the passive-intermodulation of the mounting assembly by inhibiting passive intermodulation of electromagnetic signals transmitted through the passive-intermodulation-mitigating mounting assembly.

Aspect 11 may include or use, or may optionally be combined with the subject matter of one or any combination of Aspects 9 or 10 to optionally include or use wherein the electronic component transmits or receives electromagnetic signals.

Aspect 12 may include or use, or may optionally be combined with the subject matter of one or any combination of Aspects 9 through 11 to optionally include or use the monopole.

Aspect 13 may include or use, or may optionally be combined with the subject matter of one or any combination of Aspects 9 through 12 to optionally include or use a platform assembly including the fixture, wherein the platform assembly is configured to mount to the monopole.

Aspect 14 may include or use, or may optionally be combined with the subject matter of one or any combination of Aspects 9 through 13 to optionally include or use wherein the electronic component includes one or more of an antenna or a radio.

Aspect 15 may include or use, or may optionally be combined with the subject matter of one or any combination of Aspects 9 through 14 to optionally include or use wherein the fastener extends through a mounting feature of the mounting plate.

Aspect 16 may include or use, or may optionally be combined with any portion or combination of any portions of any one or more of Aspects 1 through 15 to include or use, subject matter that may include means for performing any one or more of the functions of Aspects 1 through 15.

Each of these non-limiting aspects can stand on its own, or can be combined in various permutations or combinations with one or more of the other aspects.

The above description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular". "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A passive-intermodulation-mitigating mounting assembly for a utility or communications fixture, the mounting assembly comprising:

a first bracket defining a first through hole and including a mounting plate extending from the first bracket, wherein the mounting plate is configured to support, an antenna or a radio and the first bracket is electrically-conductive;

a second bracket defining a second through hole, wherein the second bracket is electrically-conductive;

a fastener configured to extend through the first through hole and the second through hole to couple the first bracket with the second bracket to attach the mounting assembly to the fixture, wherein the fastener is electrically-conductive; and a dielectric first bushing configured for insertion into the first through hole or the second through hole to physically and electrically isolate the electrically-conductive fastener from the electrically-conductive first bracket or the electrically-conductive second bracket such that dielectric isolation provided by the dielectric first bushing inhibits the passive intermodulation of the mounting assembly by interrupting electrical conductivity from the fastener to the electrically-conductive first bracket or the electrically-conductive second bracket through which the fastener extends, in a physically and electrically isolated manner via the first bushing, through at least one of the first through hole or the second through hole.

2. The passive-intermodulation-mitigating mounting assembly of claim 1, wherein the first bushing includes a frustoconical profile, and:
a first face and a second face opposite to the first face;
a tapered side wall extending between the first face and the second face; and
a fastener aperture extending through the first bushing between the first face and the second face, wherein the fastener aperture is configured to receive the fastener and the tapered side wall is configured to engage with a wall surrounding the first through hole or the second through hole to physically isolate the fastener when the fastener extends, through the aperture and thereby through the first through hole of the first bracket or the second through hole of the second bracket.

3. The passive-intermodulation-mitigating mounting assembly of claim 1, wherein the first bushing is configured for insertion into the first through hole and to physically and electrically isolate the fastener from the first, bracket, and further comprising:
a second bushing including the dielectric material configured for insertion into the second through hole to physically and electrically isolate the fastener from the first bracket or the second bracket, wherein the isolation of the first hushing inhibits the passive intermodulation of the mounting assembly when the fastener extends, via the first bushing, through at least one of the first, through hole or the second through hole.

4. The passive-intermodulation-mitigating mounting assembly of claim 1, wherein the first bushing projects from a face of the first bracket or the second bracket, and the first bushing is located between the fastener and the face of the first bracket or the second bracket.

5. The passive-intermodulation-mitigating mounting assembly of claim 1, wherein the dielectric material includes a polymeric material.

6. The passive-intermodulation-mitigating mounting assembly of claim 1, wherein the dielectric material has a durometer within a range of approximately 90 A to approximately 100 A.

7. The passive-intermodulation-mitigating mounting assembly of claim 1, wherein the fastener is included in a plurality of fasteners, and the plurality of fasteners includes one or more of a bolt, screw, threaded rod, washer, or nut.

8. The passive-intermodulation-mitigating mounting assembly of claim 7, wherein the first bushing physically and electrically isolates at least two of the plurality of fasteners from the first bracket or the second bracket.

9. A passive-intermodulation-mitigating mounting assembly for a utility or communications fixture, comprising:
a first bracket defining a first through hole and including a mounting plate extending from the first bracket, wherein the mounting plate is configured to support an electronic component;
the electronic component coupled to the mounting plate;
a second bracket defining a second through hole;
a fastener configured to extend through the first through hole and the second through hole to couple the first bracket with the second bracket to attach the mounting assembly to the fixture of the monopole;
wherein the first bracket, the second bracket, and the fastener are electrically-conductive; and
a dielectric first bushing configured for insertion into the first through hole or the second through hole to physically and electrically isolate the electrically-conductive fastener from the electrically-conductive first bracket, or the electrically-conductive second bracket such that dielectric isolation provided by the dielectric first bushing inhibits the passive-intermodulation of the mounting assembly by interrupting electrical conductivity from the fastener to the electrically-conductive first bracket or the electrically-conductive second bracket through which the fastener extends, in a physically and electrically isolated manner via the first bushing, through at least one of the first through hole or the second through hole.

10. The passive-intermodulation-mitigating mounting assembly of claim 9, wherein the first bushing inhibits the passive-intermodulation of the mounting assembly by inhibiting passive intermodulation of electromagnetic signals transmitted through the passive-intermodulation-mitigating mounting assembly.

11. The passive-intermodulation-mitigating mounting assembly of claim 9, wherein the electronic component transmits or receives electromagnetic signals.

12. The passive-intermodulation-mitigating mounting assembly of claim 9, further comprising the monopole.

13. The passive-intermodulation-mitigating mounting assembly of claim 9, further comprising a platform assembly including the fixture, wherein the platform assembly is configured to mount to the monopole.

14. The passive-intermodulation-mitigating mounting assembly of claim 9, wherein the electronic component includes one or more of an antenna or a radio.

15. The passive-intermodulation-mitigating mounting assembly of claim 9, wherein the fastener extends through a mounting feature of the mounting plate.

* * * * *